(12) United States Patent
Ezaki

(10) Patent No.: US 7,535,073 B2
(45) Date of Patent: May 19, 2009

(54) SOLID-STATE IMAGING DEVICE, CAMERA MODULE AND ELECTRONIC EQUIPMENT MODULE

(75) Inventor: Takayuki Ezaki, Saitama (JP)

(73) Assignee: Sony Corporation, Tokyo (JP)

( * ) Notice: Subject to any disclaimer, the term of this patent is extended or adjusted under 35 U.S.C. 154(b) by 479 days.

(21) Appl. No.: 11/208,960

(22) Filed: Aug. 22, 2005

(65) Prior Publication Data

US 2006/0043519 A1    Mar. 2, 2006

(30) Foreign Application Priority Data

Aug. 31, 2004    (JP)    ............................ P2004-253590

(51) Int. Cl.
  *H01L 31/00*    (2006.01)
  *H01L 31/0232*  (2006.01)
  *H01L 31/06*    (2006.01)

(52) U.S. Cl. .................... 257/440; 257/432; 257/460; 257/461; 257/463; 257/464; 257/E31.032; 257/E31.127

(58) Field of Classification Search ................ 257/432, 257/440, 460, 461, 463, 464, E31.032, E31.127
See application file for complete search history.

(56) References Cited

U.S. PATENT DOCUMENTS

| | | | |
|---|---|---|---|
| 5,187,583 A | 2/1993 | Hamasaki | |
| 6,150,683 A * | 11/2000 | Merrill et al. | 257/292 |
| 6,548,833 B1 * | 4/2003 | Lin et al. | 257/89 |
| 6,731,397 B1 * | 5/2004 | Merrill et al. | 358/1.16 |
| 6,821,809 B2 | 11/2004 | Abe et al. | |
| 6,852,562 B1 * | 2/2005 | Hopper et al. | 438/57 |
| 6,934,050 B2 * | 8/2005 | Merrill et al. | 358/1.16 |
| 6,946,747 B1 | 9/2005 | Mori et al. | |
| 7,101,726 B2 | 9/2006 | Yamamoto et al. | |
| 7,235,826 B2 | 6/2007 | Ezaki et al. | |
| 7,279,712 B2 | 10/2007 | Abe et al. | |
| 7,288,428 B2 | 10/2007 | Muramatsu | |
| 7,294,873 B2 | 11/2007 | Suzuki et al. | |

* cited by examiner

*Primary Examiner*—Ngan Ngo
(74) *Attorney, Agent, or Firm*—Sonnenschein Nath & Rosenthal LLP (57) ABSTRACT

To provide a back-illuminated type solid-state imaging device capable of color separation of pixels without using a color filter, and a camera module and an electronic equipment module which incorporate the solid-state imaging device. A solid-state imaging device including: a photoelectric conversion element PD formed in a semiconductor substrate 22; a reading-out part which reads out signal charges from the photoelectric conversion element PD formed on one surface side of the semiconductor substrate 22; the other surface of the semiconductor substrate 22 made to a light incidence surface; and a pixel which exclusively makes light of a specific wavelength or longer photoelectrically converted, by adjusting pn junction depths h2 [h2 r, h2 g, h2 b] between the photoelectric conversion element PD and an accumulation layer 28 on the light incidence surface side. A camera module and an electronic equipment module which incorporate the solid-state imaging device.

28 Claims, 5 Drawing Sheets

SOLID-STATE IMAGING DEVICE, CAMERA MODULE AND ELECTRONIC EQUIPMENT MODULE

CROSS PREFERENCE TO RELATED APPLICATIONS

The present invention claims the benefit of Japanese Patent Application JP 2004-253590 filed in the Japanese Patent Office on Aug. 31, 2004, the entire contents of which are incorporated herein by reference.

FIELD OF THE INVENTION

The present invention relates to a back-illuminated type solid-state imaging device in which a plurality of unit pixels which convert signal charges obtained through photoelectric conversion in photoelectric conversion elements into electrical signals to be output are arranged; to a camera module and an electronic equipment module including the solid-state imaging device.

BACKGROUND OF THE INVENTION

As solid-state imaging devices, a CMOS solid-state imaging device represented by a CMOS image sensor, and a CCD solid-state imaging device represented by a CCD image sensor are known. In solid-state imaging devices, a front-illuminated type solid-state imaging device in which light enters from the front surface side of a semiconductor substrate is widely accepted. On the other hand, a back-illuminated type solid-state imaging device in which sensitivity can be improved by making the region of a photoelectric conversion element larger than that in the front-illuminated type solid-state imaging device is disclosed.

Figure 6:
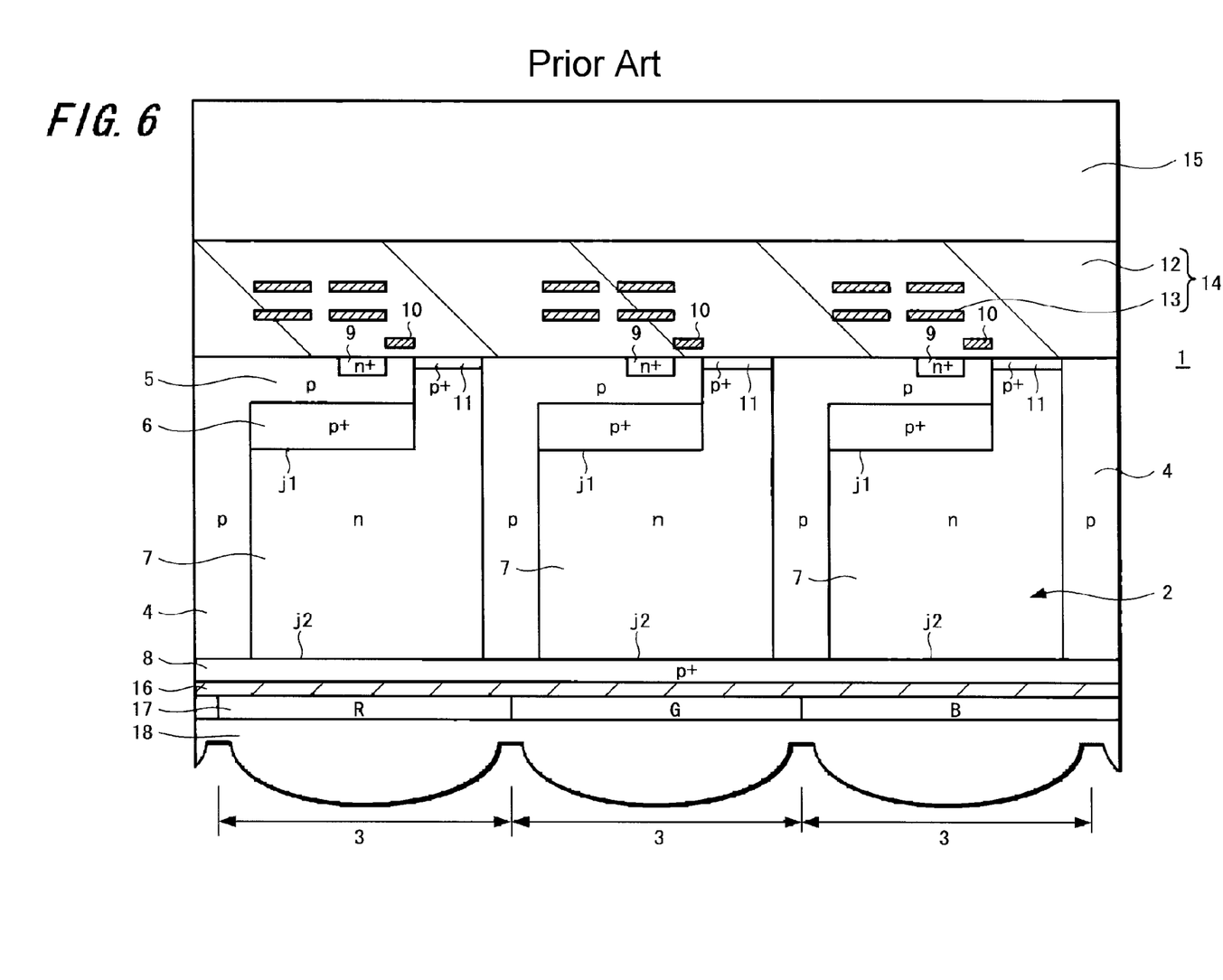
FIG. 6 is a structural view showing an example of a conventional back-illuminated type solid-state imaging device.

FIG. 6 is an example of a back-illuminated type CMOS solid-state imaging device. A CMOS solid-state imaging device 1 includes: pixel-isolation regions 4 made of p type, that is a second conductive type, semiconductor regions formed in a first conductive type, for example n-type, silicon semiconductor substrate 2 such that unit pixel regions 3 are separated from each other; and a photodiode PD which serves as a photoelectric conversion element and a required number of MOS transistors Tr for reading out signal charges obtained through photoelectric conversion and accumulated in the photodiode PD, which are formed within each of the pixel regions 3 surrounded by the p-type pixel-isolation regions 4.

The p-type pixel-isolation regions 4 are formed in the direction of the depth of the substrate such that the region extends from the front surface to the back surface of the substrate 2. The MOS transistors Tr are formed in p-type semiconductor regions 5 which are connected to the p-type pixel-isolation regions 4 and extend, on the front surface side of the substrate 2. The photodiodes PD are formed extending to the back surface side of the substrate 2 such that the photodiode extends to the lower part of the p-type semiconductor regions where the MOS transistors Tr have been formed. Each photodiode PD includes an n-type semiconductor region 7, which is formed of the n-type substrate 2 surrounded by the p-type pixel-isolation regions 4, and a high concentration p+ semiconductor region 6 that is a lower layer of the p-type semiconductor region 5; and a pn junction j1 is mainly formed between the n-type semiconductor region 7 and the p+ semiconductor region 6.

A p+ accumulation layer 8 for restraining the occurrence of dark current, which is made of a high impurity concentration p-type semiconductor region is formed at the interface on the back surface of the n-type semiconductor region 7 which constitutes a photodiode PD, in common with each pixel. Further, a p+ accumulation layer 11 is formed at the interface on the front surface of the n-type semiconductor region 7 as well. On the other hand, a MOS transistor Tr has an n-type source drain region 9 formed in the p-type semiconductor region 5, and a gate electrode 10 formed above and between a pair of n-type source drain regions 9 with a gate insulating film in between. The MOS transistor Tr shown in the figure includes the photodiode PD, the n-type source drain region 9 and the gate electrode 10 to form a readout transistor.

On the front surface of the semiconductor substrate 2 is formed a multilayer wiring layer 14 in which multilayer wirings 13 are laminated with an interlayer insulating film 12 made, for example, of a silicon dioxide film or the like in between, and on this multilayer wiring layer 14 is formed a supporting substrate 15 for reinforcement that is made of a silicon substrate, for example. On the back surface of the semiconductor substrate 2, which is a light incidence surface, is formed a color filter 17 with an insulating layer 16 in between, and an on-chip microlens 18 is formed thereon.

In this back-illuminated type CMOS solid-state imaging device 1, light enters from the back surface side of the substrate through the on-chip microlens. The light is separated into light beams of red, green and blue by the color filter 17, which enter the photodiodes PD of corresponding pixels, respectively. Subsequently, signal charge of each pixel is read out through the MOS transistor Tr on the front surface side of the substrate, and so a color image is output. Since the back-illuminated type CMOS solid-state imaging device 1 has a large area so that the photodiode PD extending to the lower layer of the MOS transistor Tr, high sensitivity can be obtained.

In the above-described back-illuminated type solid-state imaging device, a pn junction j2 is formed by the p+ accumulation layer 8 and the n-type semiconductor regions 7 of the photodiodes PD which are formed on the light incidence surface side, with the same depth in each pixel; and a pn junction j1 of the photodiode PD is similarly formed with the same depth in each pixel. In order to obtain a color image, such back-illuminated type solid-state imaging device uses the color filter 17 and photoelectrically converts light of a specific wavelength to obtain a signal from each pixel. Accordingly, there has been a problem in which the formation process of a color filter causes the number of production processes to increase, the cost increase, and the yield rate deterioration.

In light of the above, the present invention provides a back-illuminated type solid-state imaging device in which color separation of a pixel is made possible without using a color filter, and a camera module and an electronic equipment module which incorporate this solid-state imaging device.

SUMMARY OF THE INVENTION

A solid-state imaging device according to the present invention is including: a photoelectric conversion element formed in a semiconductor substrate, a reading-out part which reads out signal charge from the photoelectric conversion element formed on one surface side of the semiconductor substrate, the other surface of the semiconductor substrate made to a light incidence surface, and a pixel which makes light of a specific wavelength or longer photoelectrically converted by adjusting pn junction depth of the photoelectric conversion elements on the light incidence surface side.

A solid-state imaging device according to the present invention is including a photoelectric conversion element formed in a semiconductor substrate, a reading-out part which reads out signal charge from the photoelectric conversion element formed on one surface side of the semiconductor substrate, the other surface of the semiconductor substrate made to a light incidence surface, and a pixel which makes light of a specific wavelength or shorter photoelectrically converted by adjusting pn junction depth on one surface side in the photoelectric conversion element.

Further, in the present invention, the above solid-state imaging device may obtain a color image by combining a plurality of pixels having different positions in the direction of depth of the region of the photoelectric conversion element between first and second pn junctions.

A camera module according to the present invention includes a solid-state imaging device and an optical lens system, and is including any one of the above-described solid-state imaging device according to the present invention in which a pn junction depth is adjusted.

An electronic equipment module according to the present invention includes a solid-state imaging device, an optical lens system and signal processing portion, and is including any one of the above-described solid-state imaging device according to the present invention in which a pn junction depth is adjusted.

DESCRIPTION OF THE PREFERRED EMBODIMENTS

Hereinafter, embodiments of the present invention will be explained referring to the figures.

Figure 1:
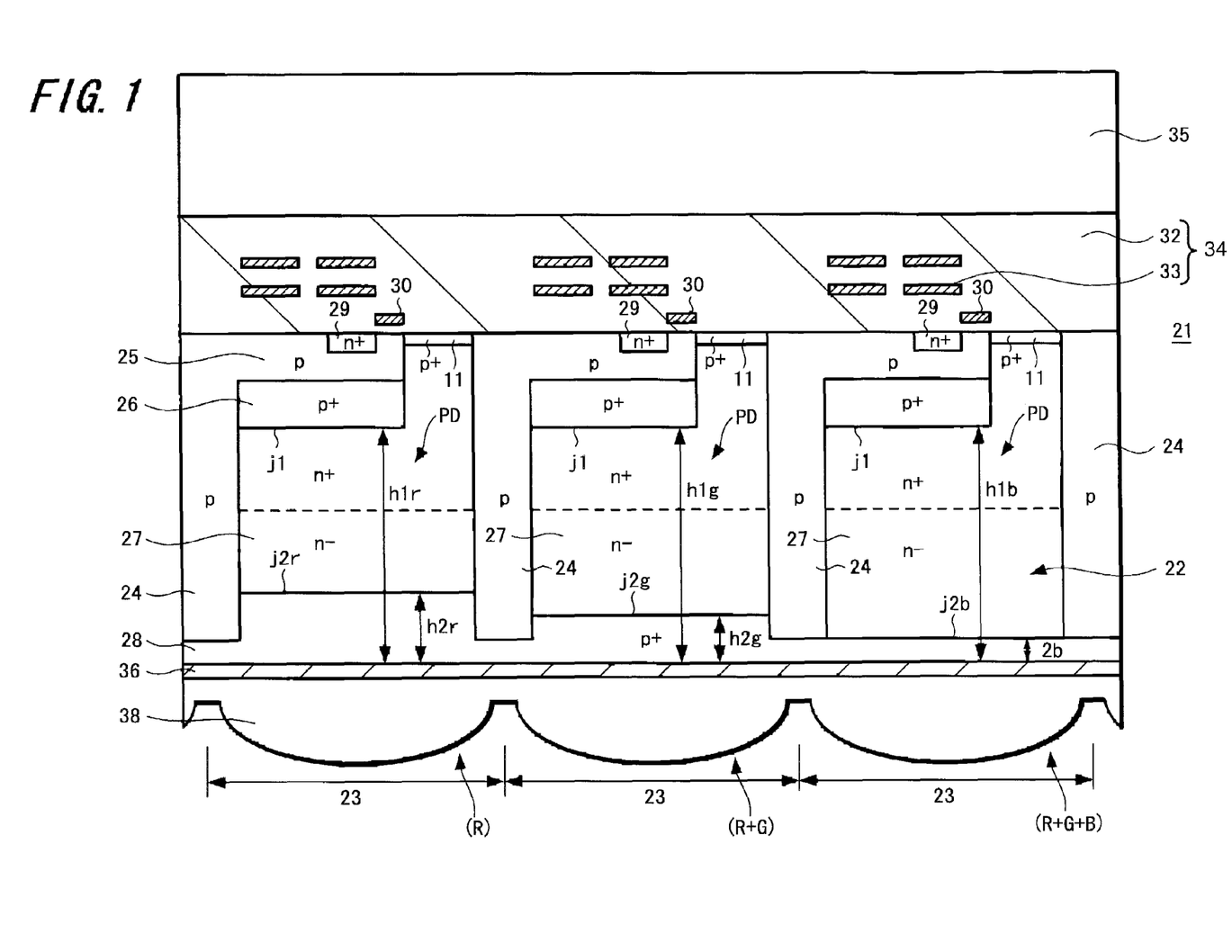
FIG. 1 is a structural view showing a first embodiment of a back-illuminated type solid-state imaging device according to the present invention.

FIG. 1 shows a first embodiment in which a back-illuminated type solid-state imaging device according to the present invention is applied to a CMOS solid-state imaging device. The figure shows a pixel portion in an imaging region.

A back-illuminated type CMOS solid-state imaging device 21 according to the present embodiment, pixel-isolation regions 24 made of p type, that is a second conductive type, semiconductor regions are formed in a first conductive type, for example n-type, silicon semiconductor substrate 22 to separate unit pixel regions 23 from each other, and a photodiode PD which serves as a photoelectric conversion element and a required number of MOS transistors Tr for reading out signal charges obtained through photoelectric conversion and accumulated in the photodiode PD are formed within each of the pixel regions 23 surrounded by the p-type pixel-isolation regions 24.

The p-type pixel-isolation regions 24 are formed in the direction of the depth of the substrate such that the regions extend from the front surface to the back surface of the substrate 22. The MOS transistors Tr are formed on the front surface side of the substrate 22 in p-type semiconductor regions 25 which are connected to the p-type pixel-isolation regions 24 and extend. The photodiodes PD are formed extending to the back surface side of the substrate 22 such that the photodiodes extend under the p-type semiconductor regions 25 where the MOS transistors Tr are formed. Each photodiode PD includes an n-type semiconductor region 27 formed of the n-type substrate 22 surrounded by the p-type pixel-isolation regions 24, and a high concentration p+ semiconductor region 26 that is an underlayer of the p-type semiconductor region 25, and a main pn junction j1 is formed between the n-type semiconductor region 27 and the p+ semiconductor region 26. The n-type semiconductor region 27, which is one of the components of the photodiode PD, has a concentration distribution in which the impurity concentration on the back surface side of the substrate is a low concentration n– and gradually increases to a high concentration n+ closer to the front surface side of the substrate.

A p+ accumulation layer 28 for restraining the occurrence of dark current that is made of a high impurity concentration p-type semiconductor region is formed with respect to each pixel at the interface on the back surface of the n-type semiconductor region 27 constituting the photodiodes PD; and a pn junction j2 is formed between the p+ accumulation layer 28 and the n-type semiconductor regions 27 of the photodiodes PD. Further, p+ accumulation layers 31 are formed at the interface on the front surfaces of the n-type semiconductor region 7 as well.

On the other hand, each MOS transistor Tr includes an n-type source drain region 29 formed in the p-type semiconductor region 25, and a gate electrode 30 formed above and between n-type source drain regions 29 with a gate insulating film in between. For example, when one pixel includes one photodiode and four MOS transistors, the MOS transistors Tr are a readout transistor, a reset transistor, an amplifier transistor and a vertical selection transistor. In FIG. 1, an n+ source drain region 29 of one side is formed within the p-type semiconductor region 25 and close to the photodiode PD, and the gate electrode 30 is formed above and between the above n+ source drain region 29 of one side and the n-type semiconductor region 27 of the photodiode PD which also serves as the other side of a source drain region with a gate insulating film in between, thus constituting a readout transistor.

On the front surface of the semiconductor substrate 2 is formed a multilayer wiring layer 34 in which multilayer wirings 33 are laminated with an interlayer insulating film 32 made, for example, of a silicon dioxide film or the like in between, and on the multilayer wiring layer 34 is formed a supporting substrate 35 for reinforcement made of a silicon substrate, for example. On the back surface of the semiconductor substrate 22, which is a light incidence surface, are formed on-chip microlenses 38 with an insulating layer 36 in between.

In the present embodiment, particularly a color filter is omitted, and only light of a specific wavelength or longer is photoelectrically converted in the photodiodes PD by adjusting junction depths h2 [h2 r, h2 g, h2 b], that are the depths from the back surface, of the pn junctions j2 [j2 r, j2 g, j2 b] between the n-type semiconductor regions 27 of one side constituting the photodiodes PD and the p+accumulation layer 28 on the light incidence surface side on the back surface of the substrate. Specifically, in the present example, the pn junction depth (in other words, the position in the direction of depth) h2 r corresponding to a red pixel is made greater than the other pn junction depths corresponding to green and blue pixels, the pn junction depth h2 b corresponding to a blue pixel is made the smallest, and the pn junction depth h2 g corresponding to a green pixel is set to in the middle of the pn junction depths of red and blue pixels (h2 r>h2 g>h2 b).

In other words, in a red pixel, the junction depth h2 r is set such that long-wavelength light which is equal to or greater in wavelength than red light will be made to enter the n-type semiconductor region 27. In a green pixel, the junction depth h2 g is set such that long-wavelength light which is equal to or greater in wavelength than green light will be made to enter the n-type semiconductor region 27. In a blue pixel, the junction depth h2 b is set such that long-wavelength light which is equal to or greater in wavelength than blue light will be made to enter the n-type semiconductor region 27.

Junction depths h2, that are the depths from the back surface, of the pn junctions j1 [j1 r, j1 g, j1 b] of the photodiodes PD of red, green and blue pixels are made to be the same junction depth (h1 r=h1 g=h1 b).

In the back-illuminated type CMOS solid-state imaging device 21 according to the present embodiment, in the photodiode PD of a red pixel, virtually only red light is photoelectrically converted and signal charges corresponding to red are accumulated; in the photodiode PD of a green pixel, virtually only green light and red light are photoelectrically converted and signal charges corresponding to green and red are accumulated; and in the photodiode PD of a blue pixel, virtually only blue light, green light and red light are photoelectrically converted and signal charges corresponding to blue, green and red are accumulated. A red output signal read out from a red pixel, a green+red output signal read out from a green pixel, and a blue+green+red output signal read out from a blue pixel are separated into a red signal, a green signal and a blue signal by a signal processing circuit, and are eventually output as color image signals.

Therefore, according to the back-illuminated type CMOS solid-state imaging device 21 of the present embodiment, color separation of pixels is possible without using a color filter, so that the structure can be simplified, and the number of production processes can be lessened to the extent of reduction in the formation processes of a color filter, thereby reducing the cost and improving the production yield.

Figure 2:
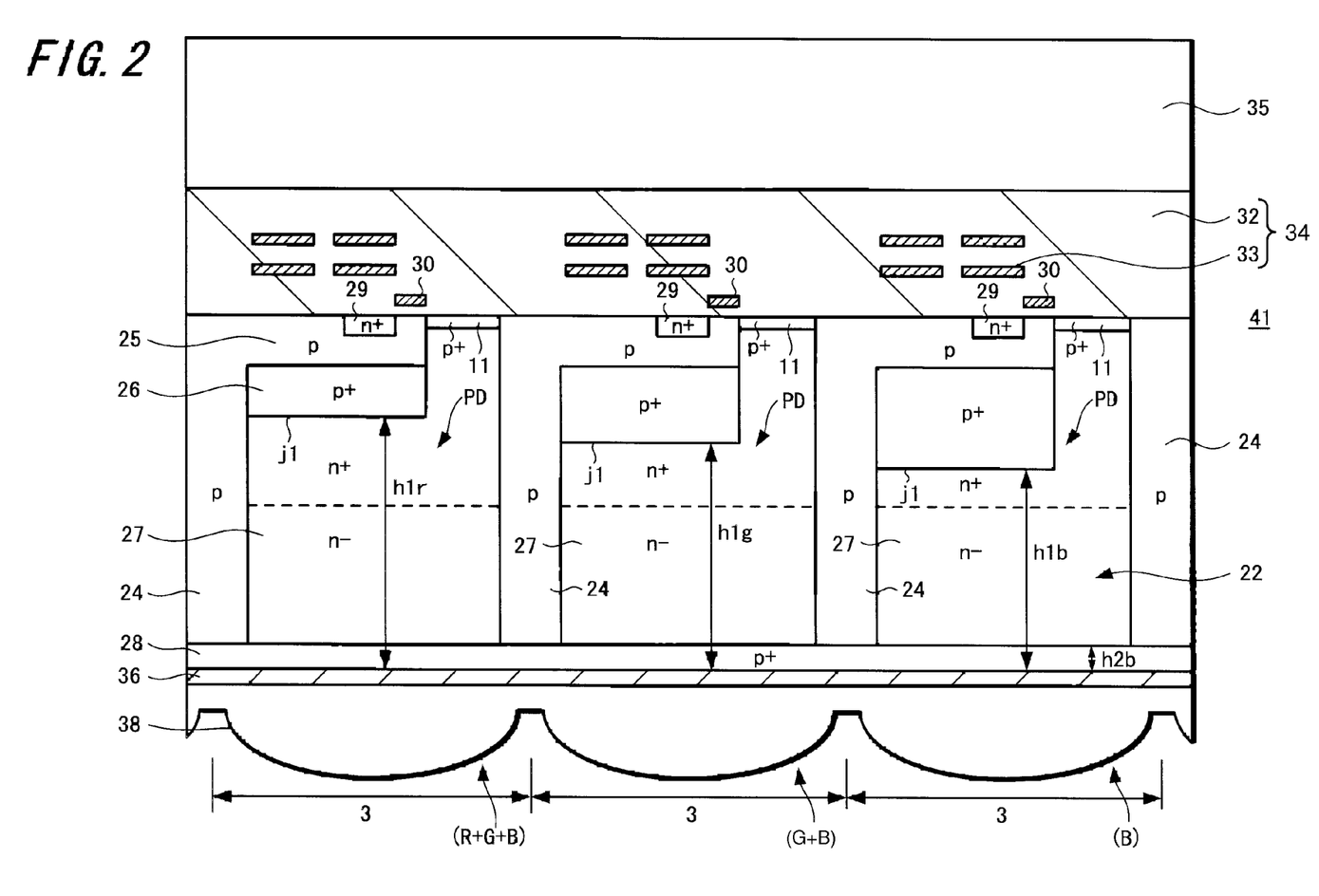
FIG. 2 is a structural view showing a second embodiment of a back-illuminated type solid-state imaging device according to the present invention.

FIG. 2 shows a second embodiment in which a back-illuminated type solid-state imaging device according to the present invention is applied to a CMOS solid-state imaging device. The figure shows a pixel portion in an imaging region, similarly to the above described embodiment.

In a back-illuminated type CMOS solid-state imaging device 41 according to the present embodiment, a color filter is omitted, and only light of a specific wavelength or shorter is photoelectrically converted in photodiodes PD by adjusting junction depths h1 [h1 r, h1 g, h1 b] from the back surface of pn junctions j1 [j1 r, j1 g, j1 b] on the front surface side of the substrate on which photodiodes PD of pixels are formed. Specifically, in the present embodiment, the pn junction depth (that is, the position in the direction of depth) h1 r corresponding to a red pixel is made greater than the other pn junction depths corresponding to green and blue pixels, the pn junction depth h1 b corresponding to a blue pixel is made the smallest, and the pn junction depth h1 g corresponding to a green pixel is set in the middle of the pn junction depths of red and blue pixels (h1 r>h1 g>h1 b).

In other words, in a red pixel, the junction depth h1 r is set such that light which is equal to or smaller in wavelength than red light will exclusively be made to enter an n-type semiconductor region 27 of one side constituting a photodiode PD. In a green pixel, the junction depth h1 g is set such that light which is equal to or smaller in wavelength than green light will exclusively be made to enter an n-type semiconductor region 27. In a blue pixel, the junction depth h1 b is set such that light which is equal to or smaller in wavelength than blue light will exclusively be made to enter an n-type semiconductor region 27.

Junction depths h2 that are the depths from the back surface of pn junctions j2 [j2 r, j2 g, j2 b] between the n-type semiconductor region 27 of one side constituting the photodiodes PD of red, green and blue pixels and a p+accumulation layer 28 on the light incidence surface side on the back surface of the substrate, are set to the same junction depth (h2 r=h2 g=h2 b).

Other structures are the same as those in the above described FIG. 1, so that redundant explanations will be omitted.

In the back-illuminated type CMOS solid-state imaging device 41 according to the present embodiment, in the photodiode PD of a red pixel, virtually only red light, green light and blue light are photoelectrically converted and signal charges corresponding to red, green and blue are accumulated; in the photodiode PD of a green pixel, virtually only green light and blue light are photoelectrically converted and signal charges corresponding to green and blue are accumulated; and in the photodiode PD of a blue pixel, virtually only blue light is photoelectrically converted and signal charges corresponding to blue are accumulated. A red+green+blue output signal read out from a red pixel, a green+blue output signal read out from a green pixel, and a blue output signal read out from a blue pixel are separated into a red signal, a green signal and a blue signal by a signal processing circuit, and are eventually output as color image signals.

Therefore, according to the back-illuminated type CMOS solid-state imaging device 41 of the present embodiment, color separation of pixels is possible without using a color filter, so that the structure can be simplified, and the number of production processes can be lessened to the extent of reduction in the formation processes of a color filter, thereby reducing the cost and improving the production yield.

Figure 3:
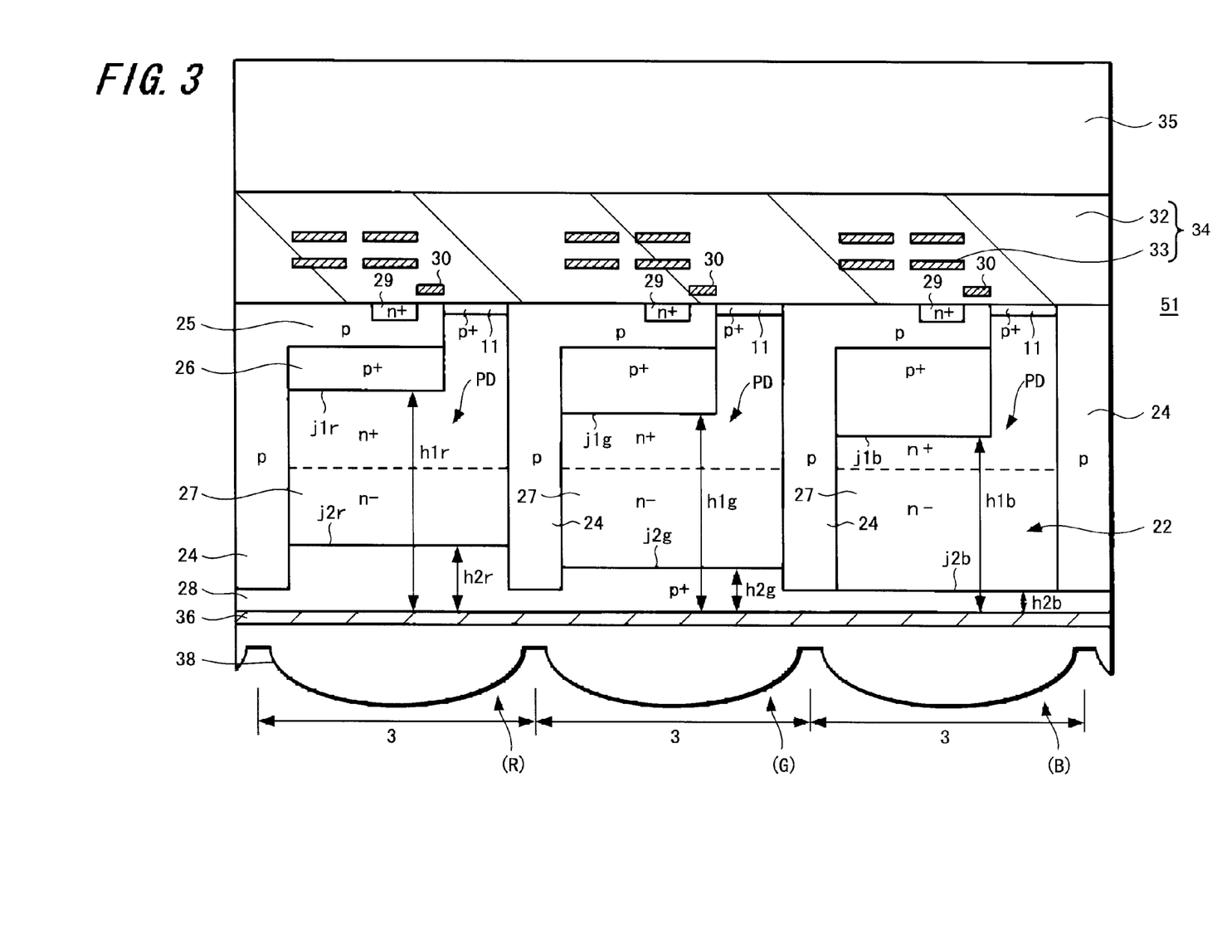
FIG. 3 is a structural view showing a third embodiment of a back-illuminated type solid-state imaging device according to the present invention.

FIG. 3 shows a third embodiment in which a back-illuminated type solid-state imaging device according to the present invention is applied to a CMOS solid-state imaging device. The figure shows a pixel portion in an imaging region, similarly to the above described embodiments.

In a back-illuminated type CMOS solid-state imaging device 51 according to the present embodiment, a color filter is omitted, and only light in a specific wavelength range is photoelectrically converted in photodiodes PD by combining the junction depths h2 [h2 r, h2 g, h2 b] in FIG. 1 that are the depths from the back surface, of the pn junctions j2 [j2 r, j2 g, j2 b] and the junction depths h1 [h1 r, h1 g, h1 b] in FIG. 2 that are the depths from the back surface, of the pn junctions j1 [j1 r, j1 g, j1 b], and by adjusting the regions of photodiodes PD between the junction depths h2 and the junction depths h1, that is, the positions in the direction of depth of n-type semiconductor regions 27.

In other words, in a red pixel, the position in the direction of depth of the n-type semiconductor region 27 is set such that light in the wavelength range of red will exclusively be made to enter the n-type semiconductor region 27. In a green pixel, the position in the direction of depth of the n-type semiconductor region 27 is set such that light in the wavelength range of green will exclusively be made to enter the n-type semiconductor region 27. In a blue pixel, the position in the direction of depth of the n-type semiconductor region 27 is set such that light in the wavelength range of blue will exclusively be made to enter the n-type semiconductor region 27.

Other structures are similar to those in the above described FIG. 1, so that redundant explanations will be omitted.

In the back-illuminated type CMOS solid-state imaging device 51 according to the present embodiment, in the photodiode PD of a red pixel, virtually only red light is photoelectrically converted and signal charges corresponding to red are accumulated; in the photodiode PD of a green pixel, virtually only green light is photoelectrically converted and signal charges corresponding to green are accumulated; and in the photodiode PD of a blue pixel, virtually only blue light is photoelectrically converted and signal charges corresponding to blue are accumulated. Subsequently, a red output signal, a green output signal and a blue output signal are output from the red pixel, the green pixel and the blue pixel, respectively, and color image signals are output through a signal processing circuit.

Therefore, according to the back-illuminated type CMOS solid-state imaging device 51 of the present embodiment, color separation of pixels is possible without using a color filter, so that the structure can be simplified, and the number of production processes can be lessened to the extent of reduction in the formation processes of a color filter, thereby reducing the cost and improving the production yield.

Although in the above-described embodiments the present invention is applied to back-illuminated type CMOS solid-state imaging devices which obtain color images, the present invention can also be applied to back-illuminated type CMOS solid-state imaging devices which obtain single-color images or images in two colors or more.

Figure 4:
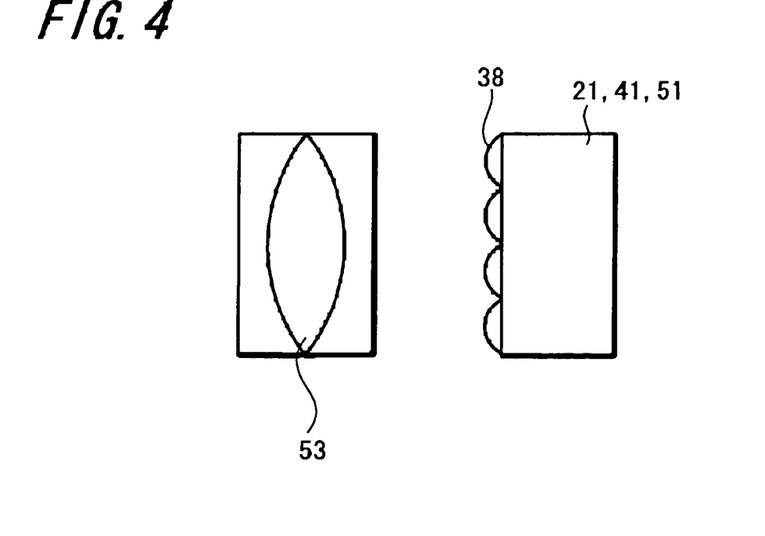
FIG. 4 is a schematic structural view showing an example of a module including a solid-state imaging device of the present invention and an optical lens system.

According to the present invention, image-pickup cameras and various modules including the solid-state imaging device of the above-described embodiments can be obtained. FIG. 4 shows an embodiment in which the above-described back-illuminated type solid-state imaging device 21, 41 or 51 is combined with an optical lens system 53.

Figure 5:
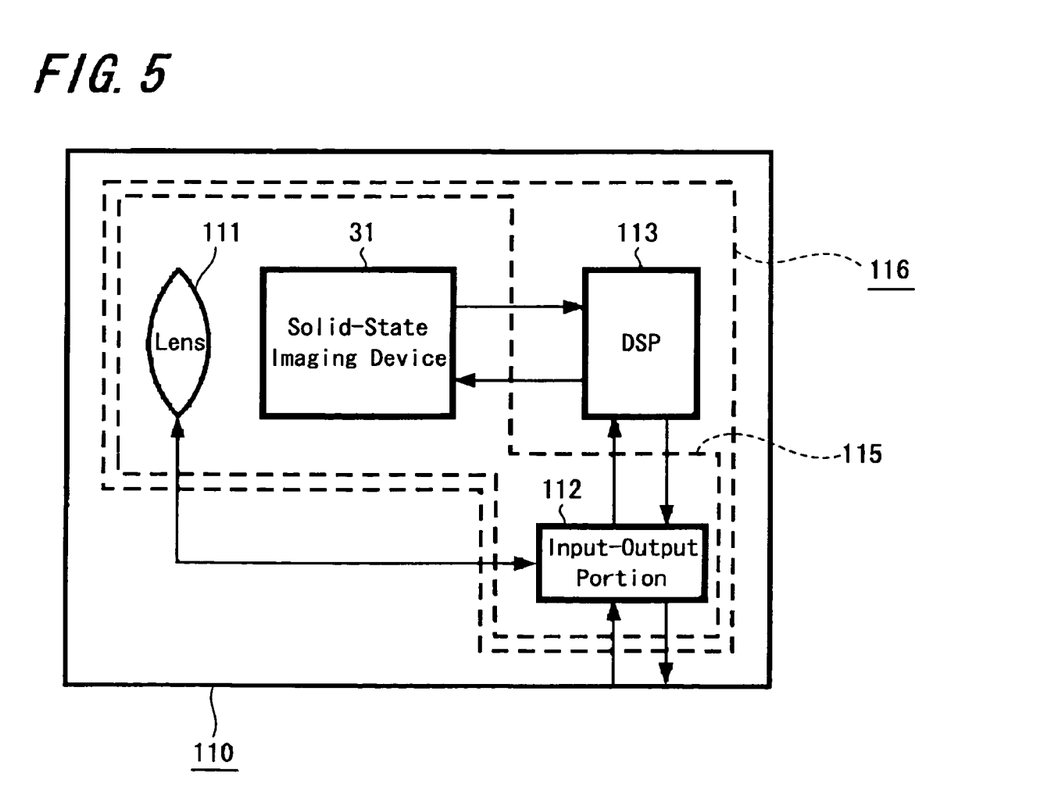
FIG. 5 is a schematic structural view showing an embodiment of a module according to the present invention.

FIG. 5 shows a schematic structure showing an embodiment of an electronic equipment module and a camera module according to the present invention. The module configuration in FIG. 5 can be applied both to electronic equipment modules and to camera modules. A module 110 according to the present embodiment includes one of the back-illuminated type solid-state imaging devices 21, 41 and 51 of the above-described embodiments, an optical lens system 111, an input-output portion 112 and digital signal processors 113, which are incorporated as one unit. Further, as an electronic equipment module or camera module 115, the module can also be formed only of the solid-state imaging device 21, 41 or 51, the optical lens system 111 and the input-output portion 112. It is also possible to form a module 116 including the solid-state imaging device 21, 41 or 51, the optical lens system 111, the input-output portion 112 and the digital signal processors 113.

According to the electronic equipment module and the camera module of the present invention, since the back-illuminated type solid-state imaging device 21, 41 or 51 of the above-described embodiments is provided, improvement in production yield can be achieved, and further, the costs can be reduced. Particularly, since there is no color filter in the solid-state imaging device, a restriction of module production processes necessary at or below the heat-resistant temperature of a color filter is removed, and so processes at the time of producing the modules are facilitated. Since the solid-state imaging device is of a back-illuminated type, modules having a high-sensitivity imaging function can be provided.

Although the solid-state imaging device according to the present invention is applied to back-illuminated type CMOS solid-state imaging devices in the above embodiment, the solid-state imaging device of the present invention can also be applied to back-illuminated type CCD solid-state imaging devices.

As described above, a solid-state imaging device of the present invention, color separation of a pixel is made without using a color filter, so that the structure can be simplified, and the number of production processes can be lessened to the extent of reduction in the formation processes of a color filter, thereby reducing the cost and improving the production yield.

As described above, a camera module and an electronic equipment module of the present invention, since the above-described solid-state imaging device according to the present invention is included, improvement in production yield can be obtained, and further, the costs can be reduced. Specifically, in the solid-state imaging device, since a color filter is not provided, a restriction of module production processes necessary at or below the heat-resistant temperature of a color filter is removed, and so processes at the time of producing the modules are facilitated. Since the solid-state imaging device is of a back-illuminated type, modules having a high-sensitivity imaging function can be provided.

What is claimed is:

1. A solid-state imaging device comprising:
a substrate having a light incident surface and an oppositely facing surface;
an accumulation layer within said substrate and adjacent said light incident surface;
a plurality of photodiodes formed in said substrate and positioned to react to light incident on said light incident surface and generate a corresponding signal charge, each photodiode having a p-n junction at an interface between said photodiode and said accumulation layer; and
a readout configuration via which said signal charges are readout from said photodiodes,
wherein,
said photodiodes are configured such that respective distances between said p-n junctions and said light incident surface vary among them so that said photodiodes generate signal charges relating to light of respectively different wavelengths and greater.

2. A solid-state imaging device according to claim 1, wherein, a first one said photodiodes generates signal charges relating to red light and light of longer wavelengths, second one of said photodiodes generates signal charges relating to red and green light and light of longer wavelengths, and a third one of said photodiodes generates signal charges relating to red, green and blue light and light of longer wavelengths.

3. A solid-state imaging device according to claim 1, wherein a color image is obtained by appropriate processing of said signal charge from a plurality of the photodiodes.

4. A solid-state imaging device comprising:
a substrate having a light incident surface and an oppositely facing surface;
an accumulation layer within said substrate and adjacent said light incident surface;
a plurality of photodiodes formed in said substrate and positioned to react to light incident on said light incident surface and generate a corresponding signal charge, each photodiode having a p-n junction at an interface between a p-type region near said read-out configuration and an n-type region between said p-type region and said accumulation layer; and
a readout configuration via which said signal charges are readout from said photodiodes, wherein,
said photodiodes are configured such that respective distances between said p-n junctions and said light incident surface vary among them so that said photodiodes generate signal charges related to light of respectively different wavelengths and shorter.

5. A solid-state imaging device according to claim 4, wherein, one of said three photodiodes generates signal charges relating to blue light and light of shorter wavelengths, one of said three photodiodes generates signal charges relating to blue and green light and light of shorter wavelengths, and one of said three photodiodes generates signal charges relating to red, green and blue light and light of shorter wavelengths.

6. A solid-state imaging device according to claim 4, wherein a color image is obtained by combining a plurality of said photodiodes and by appropriate processing of said signal charges.

7. A solid-state imaging device comprising:
a substrate having a light incident surface and an oppositely facing surface;
an accumulation layer within said substrate and adjacent said light incident surface;
a plurality of photodiodes formed in said substrate and positioned to react to light incident on said light incident surface and generate a corresponding signal charge, each photodiode having (1) a first p-n junction at an interface between a p-type region near said read-out configuration and an n-type region between said p-type region and said accumulation layer and (2) a second p-n junction at an interface between n- type region and said accumulation layer; and
a readout configuration via which said signal charges are readout from said photodiodes,
wherein,
said photodiodes are configured such that respective distances between said first p-n junctions and said light incident surface vary among them, and respective distances between said second p-n junctions and said light incident surface vary among them so that said photodiodes generate signal charges relating to light of respectively different wavelengths.

8. A solid-state imaging device according to claim 7, wherein, one of said photodiodes generates signal charges relating to blue light, one of said photodiodes generates signal charges relating to green light, and one of said photodiodes generates signal charges relating to red light.

9. A solid-state imaging device according to claim 8, wherein a color image is obtained by combining a plurality of said photodiodes.

10. A camera module comprising a solid-state imaging device and an optical lens system, said solid-state imaging device comprising:
a substrate having a light incident surface and an oppositely facing surface;
an accumulation layer within said substrate and adjacent said light incident surface;
a plurality of photodiodes formed in said substrate and positioned to react to light incident on said light incident surface and generate a corresponding signal charge, each photodiode having a p-n junction at an interface between said photodiode and said accumulation layer; and
a readout configuration via which said signal charges are readout from said photodiodes,
wherein,
said photodiodes are configured such that respective distances between said p-n junctions and said light incident surface vary among them so that said photodiodes generate signal charges relating to light of respectively different wavelengths and greater light.

11. A camera module according to claim 10, wherein a first one said photodiodes generates signal charges relating to red light and light of longer wavelengths, second one of said photodiodes generates signal charges relating to red and green light and light of longer wavelengths, and a third one of said photodiodes generates signal charges relating to red, green and blue light and light of longer wavelengths.

12. A camera module according to claim 11, further comprising a signal processing device which processes said signal charges to generate a color image.

13. A camera module comprising a solid-state imaging device and an optical lens system, said solid-state imaging device comprising:
a substrate having a light incident surface and an oppositely facing surface;
an accumulation layer within said substrate and adjacent said light incident surface;
a plurality of photodiodes formed in said substrate and positioned to react to light incident on said light incident surface and generate a corresponding signal charge, each photodiode having a p-n junction at an interface between a p-type region near said read-out configuration and an n-type region between said p-type region and said accumulation layer; and
a readout configuration via which said signal charges are readout from said photodiodes,
wherein,
said photodiodes are configured such that respective distances between said p-n junctions and said light incident surface vary among them so that said photodiodes generate signal charges related to light of respectively different wavelengths and shorter.

14. A camera module according to claim 13, wherein, one of said three photodiodes generates signal charges relating to blue light and light of shorter wavelengths, one of said three photodiodes generates signal charges relating to blue and green light and light of shorter wavelengths, and one of said three photodiodes generates signal charges relating to red, green and blue light and light of shorter wavelengths.

15. A camera module according to claim 14, further comprising a signal processing device which processes said signal charges to generate a color image.

16. A camera module comprising a solid state imaging device and an optical lens system, said solid-state imaging device comprising:
a substrate having a light incident surface and an oppositely facing surface;
an accumulation layer within said substrate and adjacent said light incident surface;
a plurality of photodiodes formed in said substrate and positioned to react to light incident on said light incident surface and generate a corresponding signal charge, each photodiode having (1) a first p-n junction at an interface between a p-type region near said read-out configuration and an n-type region between said p-type region and said accumulation layer and (2) a second p-n junction at an interface between n-type region and said accumulation layer; and
a readout configuration via which said signal charges are readout from said photodiodes, wherein,
said photodiodes are configured such that respective distances between said first p-n junctions and said light incident surface vary among them, and respective distances between said second p-n junctions and said light incident surface vary among them so that said photodiodes generate signal charges relating to light of respectively different wavelengths.

17. A camera module according to claim 16,
wherein, one of said photodiodes generates signal charges relating to blue light, one of said photodiodes generates signal charges relating to green light, and one of said photodiodes generates signal charges relating to red light.

18. A camera module according to claim 17,
wherein said solid-state imaging device combines a plurality of said photodiodes to obtain a color image.

19. An electronic equipment module comprising a solid-state imaging device, an optical lens system and a signal processing portion, said solid-state imaging device comprising:
a substrate having a light incident surface and an oppositely facing surface;
an accumulation layer within said substrate and adjacent said light incident surface;
a plurality of photodiodes formed in said substrate and positioned to react to light incident on said light incident surface and generate a corresponding signal charge, each photodiode having a p-n junction at an interface between said photodiode and said accumulation layer; and
a readout configuration via which said signal charges are readout from said photodiodes,
wherein,
said photodiodes are configured such that respective distances between said p-n junctions and said light incident surface vary among them so that said photodiodes generate signal charges relating to light of respectively different wavelengths and greater.

20. An electronic equipment module according to claim 19,
wherein, a first one said photodiodes generates signal charges relating to red light and light of longer wavelengths, second one of said photodiodes generates signal charges relating to red and green light and light of longer wavelengths, and a third one of said photodiodes generates signal charges relating to red, green and blue light and light of longer wavelengths.

21. An electronic equipment module according to claim 20,
wherein said solid-state imaging device combines a plurality of said photodiodes and performs processing of signals from said photodiodes to obtain a color image.

22. An electronic equipment module comprising a solid-state imaging device, an optical lens system and a signal processing portion, said solid-state imaging device, comprising:
a substrate having a light incident surface and an oppositely facing surface;
an accumulation layer within said substrate and adjacent said light incident surface;
a plurality of photodiodes formed in said substrate and positioned to react to light incident on said light incident surface and generate a corresponding signal charge, each photodiode having a p-n junction at an interface between a p-type region near said read-out configuration and an n-type region between said p-type region and said accumulation layer; and
a readout configuration via which said signal charges are readout from said photodiodes,
wherein,
said photodiodes are configured such that respective distances between said p-n junctions and said light incident surface vary among them so that said photodiodes generate signal charges related to light of respectively different wavelengths and shorter.

23. An electronic equipment module according to claim 22,
wherein a color image is obtained by appropriate processing of said signal charge from a plurality of the photodiodes.

24. An electronic equipment module according to claim 23,
wherein a color image is obtained by combining a plurality of said photodiodes and by appropriate processing of said signal charges.

25. An electronic equipment comprising a solid state imaging device, an optical lens system and a signal processor, said solid state imaging device, comprising:
a substrate having a light incident surface and an oppositely facing surface;
an accumulation layer within said substrate and adjacent said light incident surface;
a plurality of photodiodes formed in said substrate and positioned to react to light incident on said light incident surface and generate a corresponding signal charge, each photodiode having (1) a first p-n junction at an interface between a p-type region near said read-out configuration and an n-type region between said p-type region and said accumulation layer and (2) a second p-n junction at an interface between n-type region and said accumulation layer; and
a readout configuration via which said signal charges are readout from said photodiodes,
wherein,
said photodiodes are configured such that respective distances between said first p-n junctions and said light incident surface vary among them, and respective distances between said second p-n junctions and said light incident surface vary among them so that said photodiodes generate signal charges relating to light of respectively different wavelengths.

26. An electronic equipment module according to claim 25,
wherein, one of said photodiodes generates signal charges relating to blue light, one of said photodiodes generates signal charges relating to green light, and one of said photodiodes generates signal charges relating to red light.

27. An electronic equipment module according to claim 26
wherein a color image is obtained by combining a plurality of said photodiodes.

28. The solid state imaging device of claim 1, wherein no color filters are used between said light incident surface and light incident upon said light incident surface.

* * * * *